US012227845B2

United States Patent
Song et al.

(10) Patent No.: US 12,227,845 B2
(45) Date of Patent: Feb. 18, 2025

(54) VAPOR DEPOSITION DEVICE CAPABLE OF RECIPROCATING ROTATION AND LIFTING

(71) Applicant: Betone Technology Shanghai, Inc., Shanghai (CN)

(72) Inventors: Weicong Song, Shanghai (CN); Wenjun Xie, Shanghai (CN)

(73) Assignee: Betone Technology Shanghai, Inc., Shanghai (CN)

( * ) Notice: Subject to any disclaimer, the term of this patent is extended or adjusted under 35 U.S.C. 154(b) by 0 days.

(21) Appl. No.: 18/699,313

(22) PCT Filed: Sep. 22, 2022

(86) PCT No.: PCT/CN2022/120468
§ 371 (c)(1),
(2) Date: Apr. 8, 2024

(87) PCT Pub. No.: WO2023/082855
PCT Pub. Date: May 19, 2023

(65) Prior Publication Data
US 2024/0327987 A1    Oct. 3, 2024

(30) Foreign Application Priority Data

Nov. 11, 2021   (CN) .......................... 202111330341.1

(51) Int. Cl.
*C23C 16/458*    (2006.01)
*C23C 14/50*    (2006.01)

(52) U.S. Cl.
CPC ........ *C23C 16/4584* (2013.01); *C23C 14/505* (2013.01); *C23C 16/4586* (2013.01)

(58) Field of Classification Search
None
See application file for complete search history.

(56) References Cited

U.S. PATENT DOCUMENTS

2005/0155710 A1    7/2005 Tseng et al.

FOREIGN PATENT DOCUMENTS

| CN | 101224862 A | 7/2008 |
| CN | 204325498 A | 5/2015 |

(Continued)

OTHER PUBLICATIONS

Machine Generated English Translation of CN111455341. Published Sep. 8, 2020. (Year: 2020).*

(Continued)

*Primary Examiner* — Sylvia MacArthur
(74) *Attorney, Agent, or Firm* — IPRTOP LLC

(57) ABSTRACT

A vapor deposition device capable of reciprocating rotation and lifting is disclosed. The vapor deposition device includes a vapor deposition cavity, a base station, a base shaft, a telescopic assembly, a passive lifting rotation member, a rotation mechanism, and a lifting mechanism. The rotation mechanism is fixedly connected with the telescopic assembly, and configured to drive the telescopic assembly to perform a reciprocating rotational motion, which in turn drives the base station, the base shaft, and the passive lifting rotation member to perform a reciprocating rotational motion in sequence. The lifting mechanism is rotatably and slidably connected with the passive lifting rotation member, and configured to drive the passive lifting rotation member to move up and down, which in turn drives the base shaft and the base station to move up and down. The telescopic assembly extends when the base station ascends and shortens when the base station descends.

17 Claims, 8 Drawing Sheets

(56) References Cited

FOREIGN PATENT DOCUMENTS

| | | |
|---|---|---|
| CN | 110205592 A | 9/2019 |
| CN | 111364026 | 7/2020 |
| CN | 111364026 Y | 7/2020 |
| CN | 111455341 Y | 7/2020 |
| CN | 112103238 A | 12/2020 |
| CN | 113430504 A | 9/2021 |
| CN | 113774352 | 12/2021 |
| CN | 113774360 | 12/2021 |
| WO | WO-2010032750 A1 * 3/2010 ......... C23C 16/4581 |
| WO | 2015188353 A | 12/2015 |

OTHER PUBLICATIONS

Machine Generated English Translation of CN111364026. Published Jul. 3, 2020. (Year: 2020).*

* cited by examiner

VAPOR DEPOSITION DEVICE CAPABLE OF RECIPROCATING ROTATION AND LIFTING

FIELD OF THE INVENTION

The present disclosure belongs to the technical field of semiconductor devices, and relates to a vapor deposition device capable of reciprocating rotation and lifting.

BACKGROUND OF THE INVENTION

The vacuum degree and film deposition uniformity inside the reaction chamber are critical for vapor deposition (such as physical vapor deposition (PVD), chemical vapor deposition (CVD), atomic layer deposition (ALD), etc.) devices. In related technologies, there are design schemes that independently utilize rotation devices and lifting devices to improve film uniformity, but there is no more effective scheme that combines both rotation and lifting devices to achieve better deposition results. The main reasons are as follows:
(1) It is difficult to design a mechanical structure that can perform both rotation and lifting functions simultaneously, without interfering with each other.
(2) Circumferential rotation risks entanglement of electrical wires, especially when the rotation is unidirectional, which can easily cause physical entanglement and damage of electrical wires.
(3) The rotation or lifting structure can disrupt the vacuum sealing of vapor deposition devices, and this is a problem in the related technologies fail to address.
(4) Motors with strong driving force generate a strong magnetic field, and the related technologies do not account for the impact of the strong magnetic field on the deposition process.

SUMMARY OF THE INVENTION

In view of the above-mentioned shortcomings, the present disclosure provides a vapor deposition device capable of reciprocating rotation and lifting for solving problems in the related technologies.

The vapor deposition device capable of reciprocating rotation and lifting includes: a vapor deposition cavity, wherein a rotation through hole is formed on a bottom of the vapor deposition cavity; a base, including a base station and a base shaft, wherein the base station is located in the vapor deposition cavity, the base shaft is located below the base station and fixedly connected with the base station, and a bottom end of the base shaft passes through the rotation through hole to extend out of the vapor deposition cavity; a telescopic assembly, including a telescopic tubular member and a driving ring, wherein the telescopic tubular member is sleeved around the base shaft, a top end of the telescopic tubular member is fixedly connected with the base station, and a bottom end of the telescopic tubular member is fixedly connected with the driving ring; a passive lifting rotation member, sleeved around the base shaft and fixedly connected with the base shaft; a rotation mechanism, fixedly connected with the telescopic assembly, and configured to drive the telescopic assembly to perform a reciprocating rotational motion, which in turn drives the base station, the base shaft, and the passive lifting rotation member to perform a reciprocating rotational motion in sequence; and a lifting mechanism, rotatably and slidably connected with the passive lifting rotation member, and configured to drive the passive lifting rotation member to move up and down, which in turn drives the base shaft and the base station to move up and down; wherein the telescopic assembly extends when the base station ascends and shortens when the base station descends.

Optionally, the base station includes a heating member, an interior of the base shaft is hollow and allows an electrical wire connected with the heating member to pass through.

Optionally, the telescopic tubular member includes corrugated pipes.

Optionally, the rotation mechanism includes a vacuum isolation ring, an active rotation assembly, and a passive rotation assembly. The vacuum isolation ring is sleeved around the base shaft, a top end of the vacuum isolation ring is hermetically connected with a bottom plate of the vapor deposition cavity, and a bottom end of the vacuum isolation ring is hermetically connected with the lifting mechanism. The passive rotation assembly is surrounded by the vacuum isolation ring and is fixedly connected with the driving ring. The active rotation assembly surrounds the vacuum isolation ring and is configured to drive the passive rotation assembly to perform a reciprocating rotational motion through magnetic force.

Optionally, the active rotation assembly includes an active rotation block and at least one active magnet, and the at least one active magnet is disposed on a surface of the active rotation block facing the passive rotation assembly. The passive rotation assembly includes a passive rotation block and at least one passive magnet, and the at least one passive magnet is disposed on a surface of the passive rotation block facing the active rotation assembly.

Optionally, the passive rotation assembly further includes a first passive rotation connector and a second passive rotation connector, both of which are located in the rotation through hole. The first passive rotation connector is fixedly connected to a top end of the passive rotation block and a side surface of the driving ring, a first guide rail is disposed on a bottom surface of the first passive rotation connector, and a first protrusion extending into the first guide rail is disposed on a top surface of the vacuum isolation ring. The second passive rotation connector is fixedly connected to a bottom of the first passive rotation connector and a bottom of the driving ring.

Optionally, both the first passive rotation connector and the second passive rotation connector are made of magnetic shielding materials.

Optionally, the first protrusion is slidably connected to the passive rotation block through a fifth bearing.

Optionally, the active rotation block is slidably connected to the vacuum isolation ring through a first bearing and a second bearing, the first bearing is located above the active magnet, and the second bearing is located below the active magnet. The passive rotation block is slidably connected to the vacuum isolation ring through a third bearing and a fourth bearing, the third bearing is located above the passive magnet, and the fourth bearing is located below the passive magnet.

Optionally, a rotary sliding support is disposed between a bottom of the vacuum isolation ring and a bottom of the passive rotation block.

Optionally, the rotary sliding support includes a first sliding plate, one or more sliding posts, a limiting ring, and a second sliding plate. The first sliding plate is located above the second sliding plate, the one or more sliding posts and the limiting ring are located between the first sliding plate and the second sliding plate, and the one or more sliding posts are circumferentially and evenly embedded in the limiting ring.

Optionally, the rotation mechanism further includes a rotary drive assembly, the rotary drive assembly includes a stator and a rotor. The rotor is fixedly connected with a bottom of the active rotation assembly, and the stator is fixedly connected with the vapor deposition cavity through a fixing bracket, sleeved around the rotor, and configured to drive the rotor to perform a reciprocating rotational motion.

Optionally, the fixing bracket includes a first bracket and a second bracket, a top end of the first bracket is fixedly connected with the vapor deposition cavity, the second bracket is disposed at one side of the first bracket and is sleeved around the active rotation assembly, and the stator is fixedly connected with the second bracket.

Optionally, the rotary drive assembly further includes a stator connector and a rotor connector, the stator connector is fixedly connected with the stator, a second guide rail is disposed at a bottom of the rotor, a second protrusion extending into the second guide rail is disposed at a top of the rotor connector and slidably connected with the rotor, and the stator connector and the rotor connector are slidably connected through a sixth bearing.

Optionally, the lifting mechanism includes a pipe-sleeve fixing ring, a telescopic-pipe sleeve, a wire accommodating cavity, a wire-accommodating-cavity connector, a lifting station, and a lifting drive device; The wire-accommodating-cavity connector is located in the passive lifting rotation member and is rotatably and slidably connected with the passive lifting rotation member through a seventh bearing. A top of the wire accommodating cavity is fixedly connected with the wire-accommodating-cavity connector, and a bottom of the wire accommodating cavity is hermetically connected with the lifting station. The telescopic-pipe sleeve is sleeved around the wire accommodating cavity and is apart from an outer side wall of the wire accommodating cavity by a predetermined distance. The pipe-sleeve fixing ring is sleeved around the passive lifting rotation member, a top of the pipe-sleeve fixing ring is hermetically connected with a bottom of the vacuum isolation ring, a bottom of the pipe-sleeve fixing ring is hermetically connected with a top end of the telescopic-pipe sleeve, and a bottom end of the telescopic-pipe sleeve is hermetically connected with a bottom of the wire accommodating cavity. The lifting drive device is connected with the lifting station and configured to drive the lifting station to move up and down, which in turn drives the wire accommodating cavity, the wire-accommodating-cavity connector, the passive lifting rotation member, the base shaft, and the base station to move up and down in sequence. The telescopic-pipe sleeve shortens when the wire accommodating cavity ascends and extends when the wire accommodating cavity descends.

Optionally, the telescopic-pipe sleeve includes corrugated pipes.

Optionally, the lifting drive device includes a lifting drive motor, a threaded rod, a threaded block, and a lifting bracket. The lifting drive motor is connected with the threaded rod and configured to drive the threaded rod to rotate, the threaded block is sleeved around the threaded rod and configured to ascend or descend along with a rotation of the threaded rod, and the lifting bracket is fixedly connected to the threaded block and the lifting station.

Optionally, the lifting drive device is fixedly connected with the vapor deposition cavity through a fixing bracket. The lifting drive device further includes a lifting slide rail and a lifting guide rail, the lifting guide rail is disposed at one side of the fixing bracket, the lifting slide rail is disposed at one side of the lifting bracket, and the lifting slide rail matches the lifting guide rail in shape and is configured to slidably ascend or descend when the lifting guide rail ascend or descend.

Optionally, a bottom plate of the vapor deposition cavity is made of magnetic shielding materials, or a bottom plate of the vapor deposition cavity includes a magnetic shielding material layer.

Optionally, the vapor deposition device further includes a magnetic shielding protective cover. The magnetic shielding protective cover is sleeved around the rotation mechanism and connected with the bottom plate of the vapor deposition cavity.

As described above, the vapor deposition device of the present disclosure allows wafer bases to lift and rotate simultaneously without interfering with each other, and is also capable of heating the wafers. It also avoids the problem of physical entanglement and damage of electrical wires by using a reciprocating rotation mechanism. Furthermore, by combining a lifting drive motor that adopts a torque-driven mode, a rotation mechanism that employs magnetic coupling principles, and a design that utilizes purely physical isolation, the vapor deposition device can achieve a purely physical ultra-high vacuum state. The bottom of the vapor deposition cavity has a magnetic shielding assembly, which can prevent the strong magnetic field generated by a magnetic coupling rotation mechanism from adversely affecting the deposition environment inside the cavity as well as the external environment, effectively avoiding possible damages to the surrounding electrical devices and the operator's health.

REFERENCE NUMERALS

Figure 1:
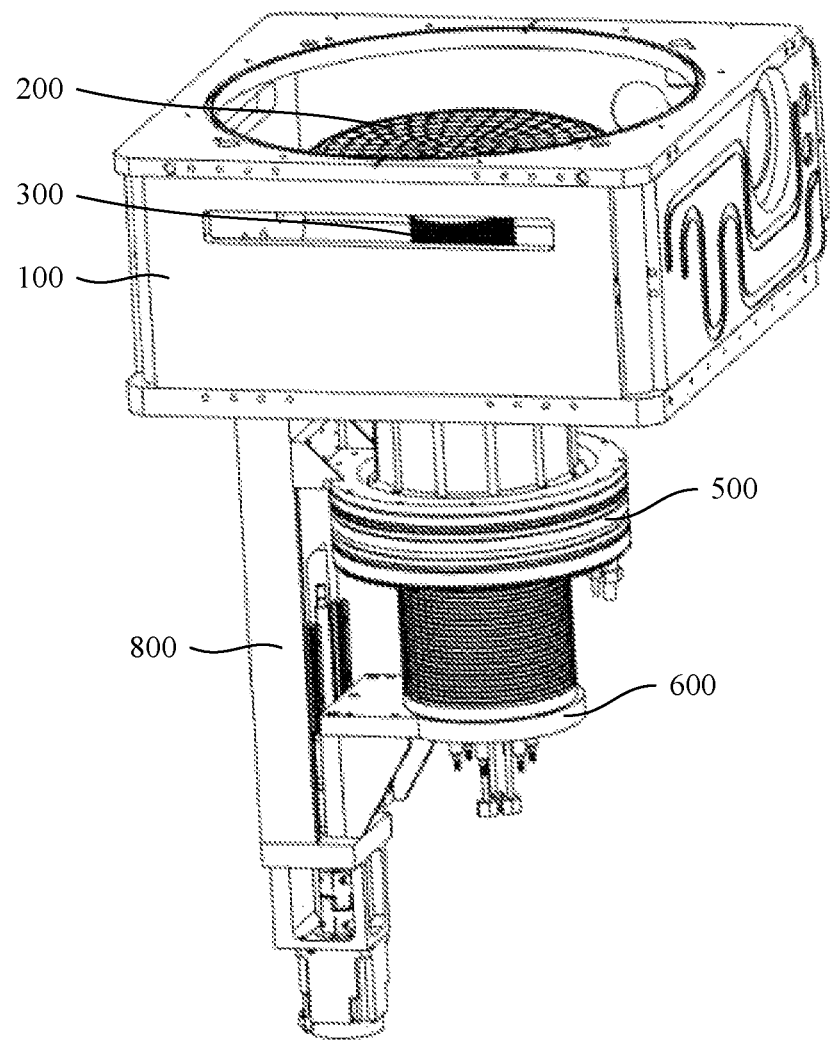
FIG. 1 shows a schematic perspective view of a vapor deposition device capable of reciprocating rotation and lifting according to the present disclosure.

100 Vapor deposition cavity, 101 Rotation through hole, 200 Base, 201 Base station, 202 Base shaft, 203 Electrical wire, 300 Telescopic assembly, 301 Telescopic tubular member, 302 Driving ring, 400 Passive lifting rotation member, 500 Rotation mechanism, 501 Vacuum isolation ring, 502 Active rotation block, 503 Active magnet, 504 Passive rotation block, 505 Passive magnet, 506 First passive rotation connector, 507 Second passive rotation connector, 508 First guide rail, 509 First protrusion, 510 First bearing, 511 Second bearing, 512 Third bearing, 513 Fourth bearing, 514 Fifth bearing, 515 Stator, 516 Rotor, 517 Stator connector, 518 Rotor connector, 519 Second guide rail, 520 Second protrusion, 521 Sixth bearing, 522 Rotary sliding support, 522a First sliding plate, 522b Sliding posts, 522c Limiting ring, 522d Second sliding plate, 600 Lifting mechanism, 601 Pipe-sleeve fixing ring, 602 Telescopic-pipe sleeve, 603 Wire accommodating cavity, 604 Wire-accommodating-cavity connector, 605 Lifting station, 606 Seventh bearing, 607 Lifting drive motor, 608 Threaded rod, 609 Threaded block, 610 Lifting bracket, 611 Lifting slide rail, 612 Lifting guide rail, 701 First sealing ring, 702 Second sealing ring, 703 Third sealing ring, 800 Fixing bracket, 801 First bracket, 802 Second bracket, 900 Magnetic shielding protective cover.

DETAILED DESCRIPTION OF THE INVENTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Please refer to FIGS. 1 to 14. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

The present disclosure provides a vapor deposition device capable of reciprocating rotation and lifting. Please refer to FIGS. 1 and 2, which show a schematic perspective view and a schematic cross-sectional view of the vapor deposition device, respectively. The vapor deposition device includes a vapor deposition cavity 100, a base 200, a telescopic assembly 300, a passive lifting rotation member 400, a rotation mechanism 500, and a lifting mechanism 600.

Figure 3:
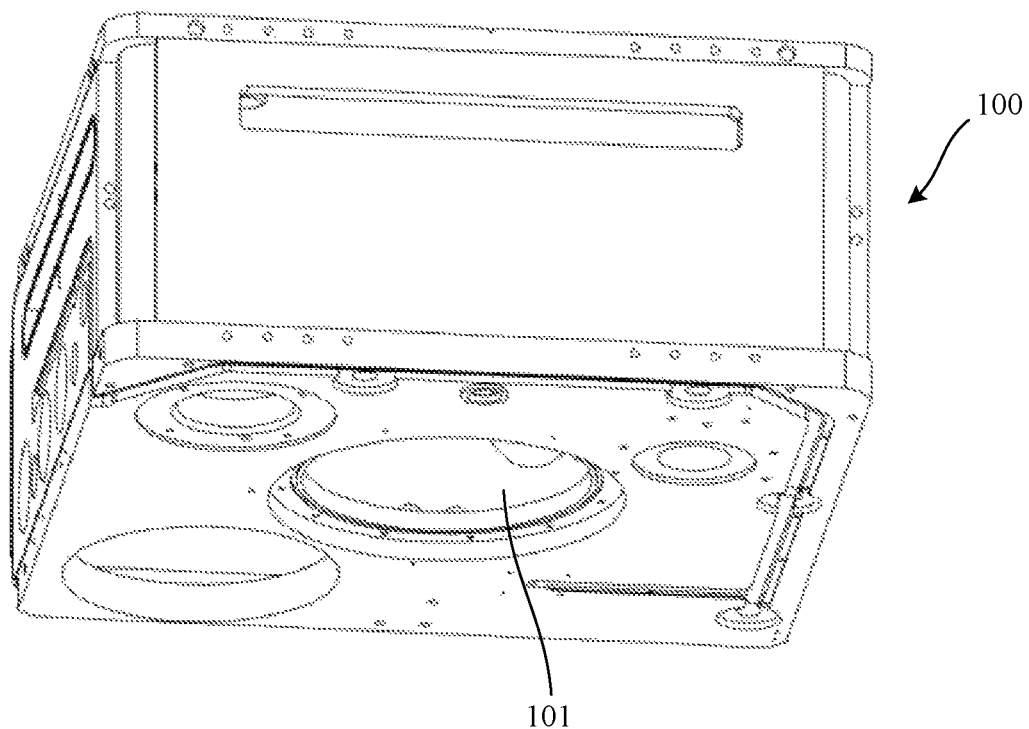
FIG. 3 shows a schematic perspective view of a vapor deposition cavity according to the present disclosure.
Figure 4:
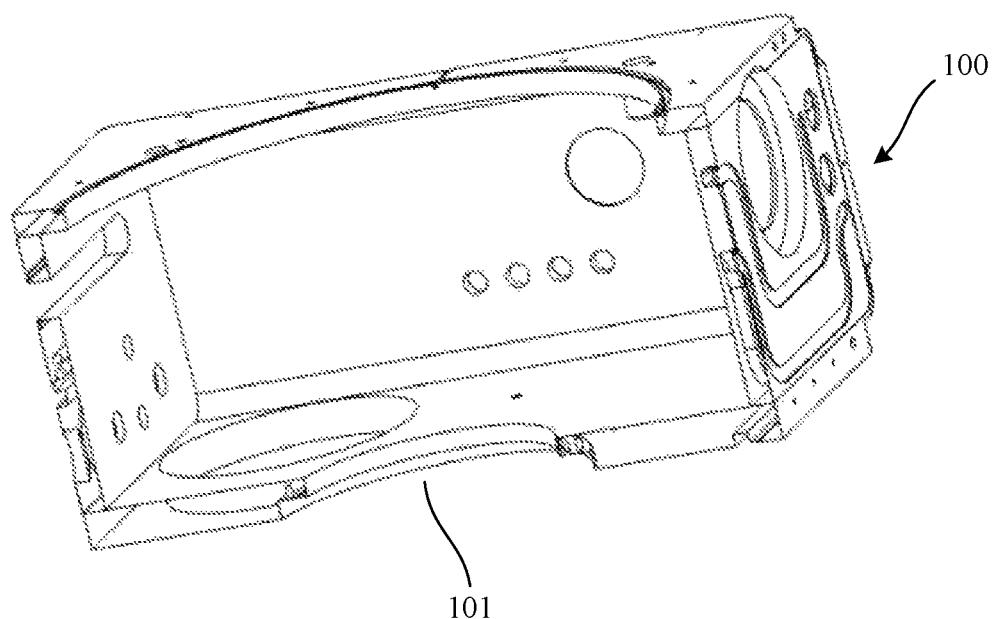
FIG. 4 shows a schematic cross-sectional view of the vapor deposition cavity according to the present disclosure.

Specifically, please refer to FIGS. 3 and 4, which show a schematic perspective view and a schematic cross-sectional view of the vapor deposition cavity 100, respectively. A rotation through hole 101 is formed on a bottom of the vapor deposition cavity 100.

Figure 5:
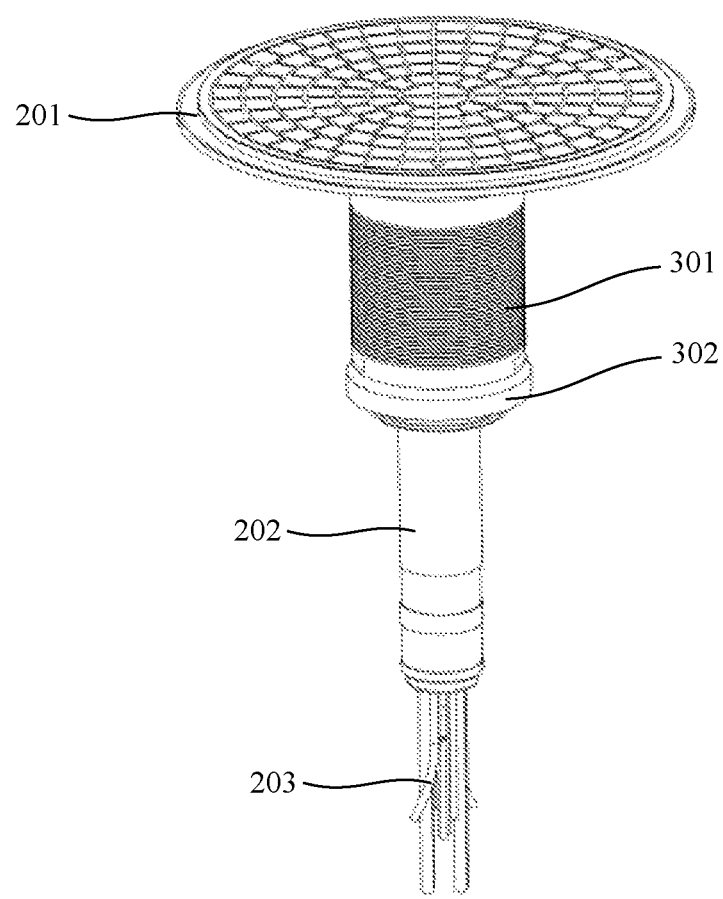
FIG. 5 shows a schematic perspective view of a base and a telescopic assembly according to the present disclosure.
Figure 6:
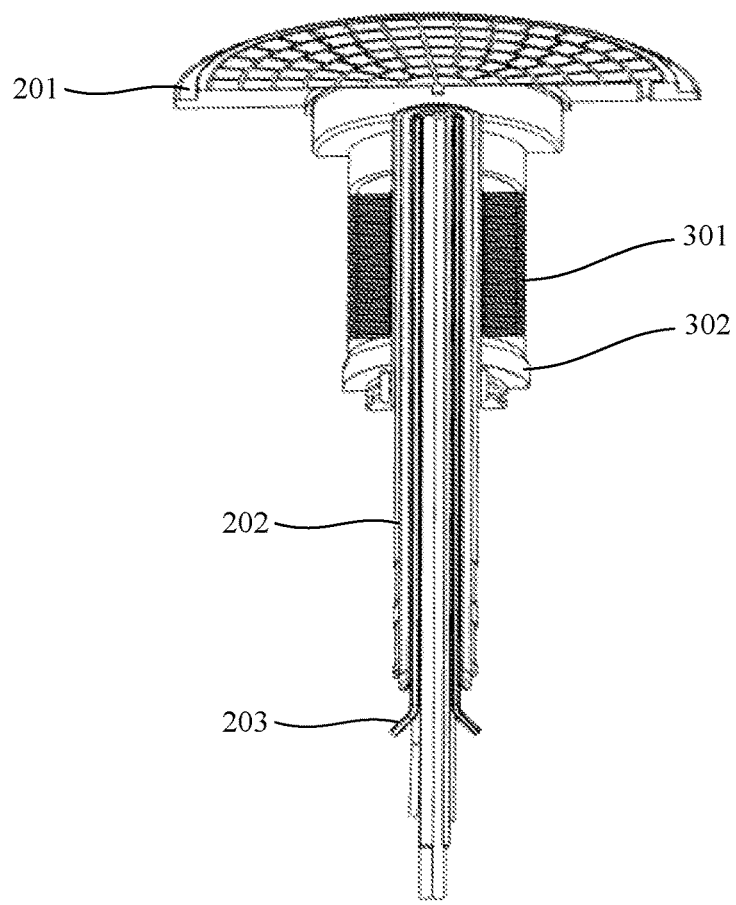
FIG. 6 shows a schematic cross-sectional view of the base and the telescopic assembly according to the present disclosure.

Specifically, please refer to FIGS. 5 and 6. FIG. 5 shows a schematic perspective view of the base 200 and the telescopic assembly 300, and FIG. 6 shows a schematic cross-sectional view of the base 200 and the telescopic assembly 300. The base 200 includes a base station 201 and a base shaft 202. The base station 201 is located in the vapor deposition cavity 100, the base shaft 202 is located below the base station 201 and fixedly connected with the base station 201, and a bottom end of the base shaft 202 passes through the rotation through hole 101 to extend out of the vapor deposition cavity 100. The telescopic assembly 300 includes a telescopic tubular member 301 and a driving ring 302. The telescopic tubular member 301 is sleeved around the base shaft 202, a top end of the telescopic tubular member 301 is fixedly connected with the base station 201, and a bottom end of the telescopic tubular member 301 is fixedly connected with the driving ring 302. The telescopic assembly 300 extends when the base station 201 ascends, and shortens when the base station 201 descends. In one embodiment, the telescopic tubular member 301 includes corrugated pipes. The telescopic tubular member 301 can prevent particles in the vapor deposition cavity 100 from entering the rotation mechanism 500, and the latter may result in undesirable effects (for example, the rotation mechanism 500 will be contaminated). The telescopic tubular member 301 can also buffer the lifting of the base station 201.

As an example, the base station 201 includes a heating member (not shown), the interior of the base shaft 202 is hollow and allows an electrical wire 203 connected with the heating member to pass through, and the electrical wire 203 is configured to supply power to the base station 201 and other related devices.

Figure 2:
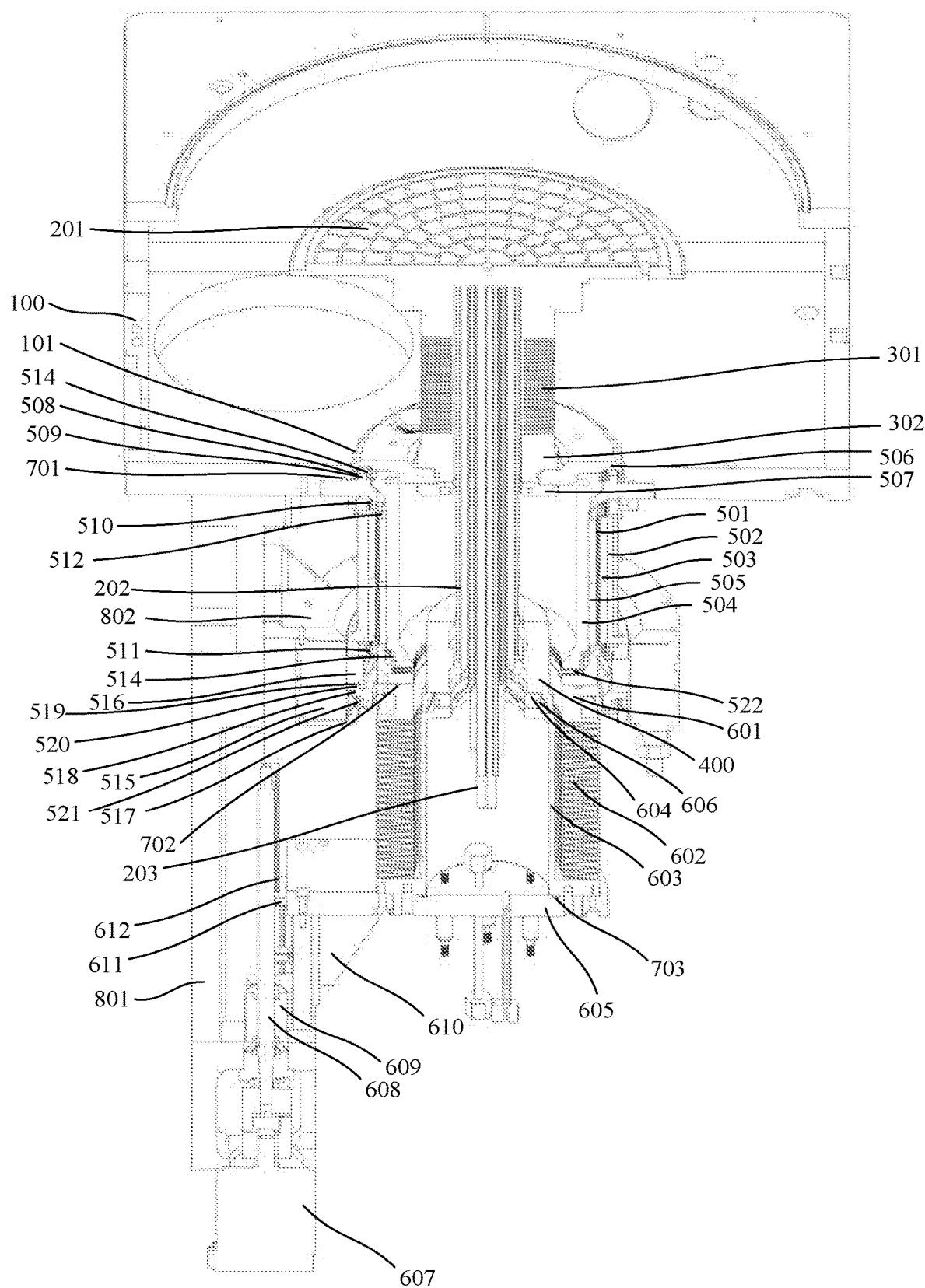
FIG. 2 shows a schematic cross-sectional view of the vapor deposition device capable of reciprocating rotation and lifting according to the present disclosure.

Referring to FIG. 2, the passive lifting rotation member 400 is sleeved around the base shaft 202 and is fixedly connected with a lower portion of the base shaft 202. It should be noted that, since the heating member is not shown, an upper portion of the base shaft 202 in FIG. 1 appears to be not connected with the base station, but in fact, the upper portion of the base shaft 202 is fixedly connected with the base station 201.

Figure 7:
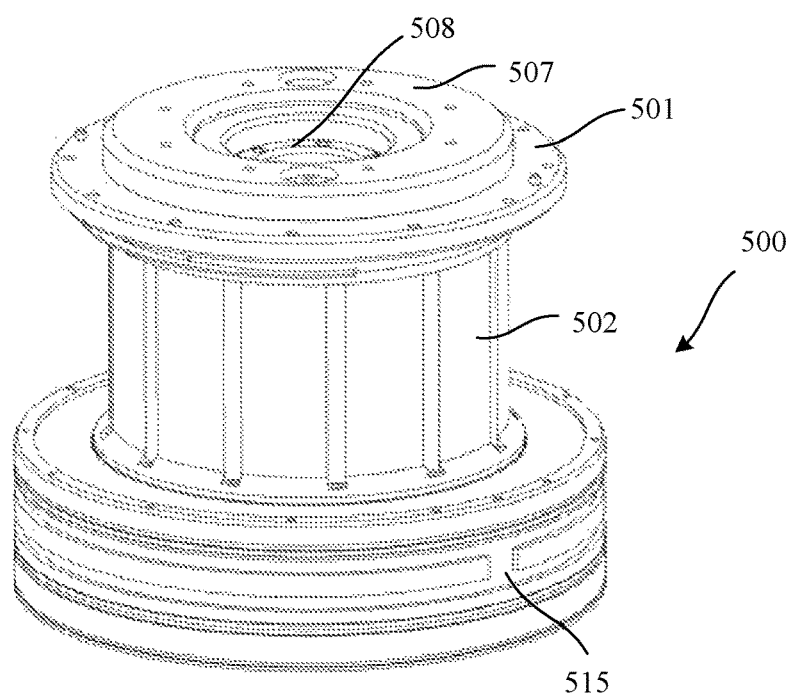
FIG. 7 shows a schematic perspective view of a rotation mechanism according to the present disclosure, viewing from one angle.
Figure 8:
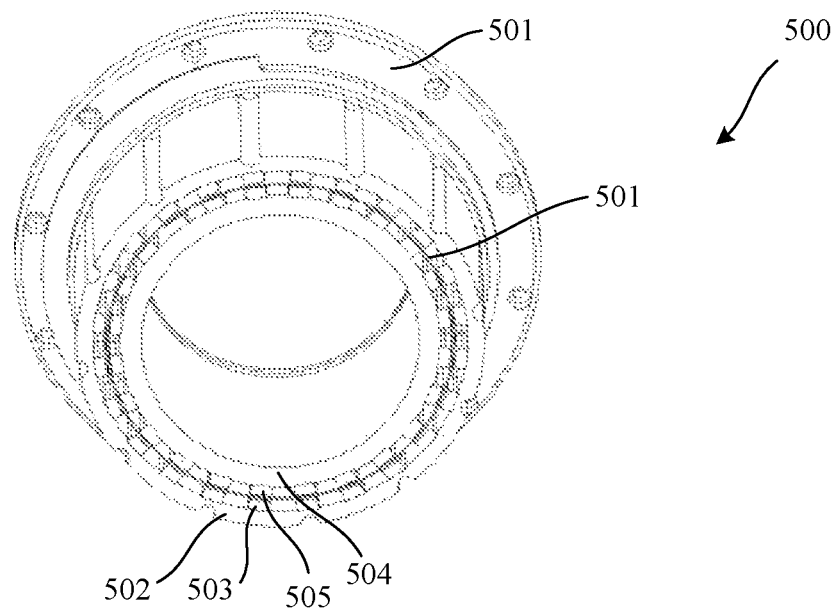
FIG. 8 shows a schematic perspective view of the rotation mechanism according to the present disclosure, viewing from another angle.
Figure 9:
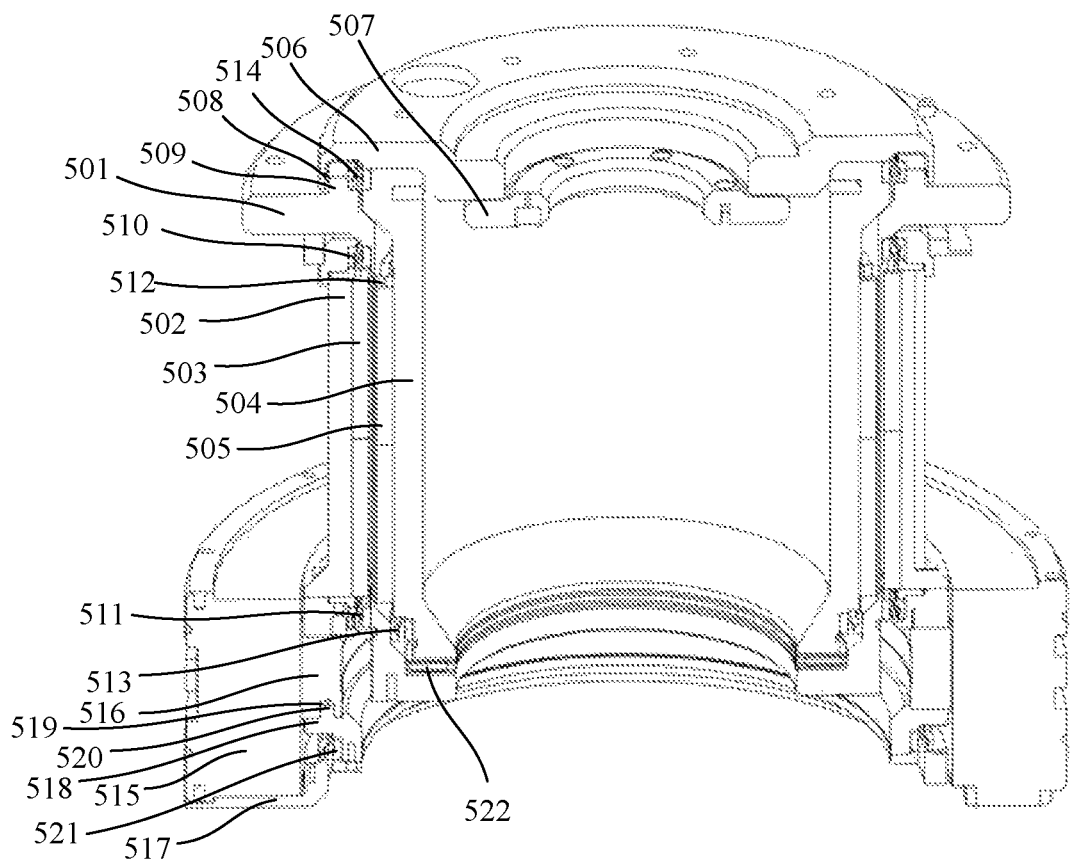
FIG. 9 shows a schematic cross-sectional view of the rotation mechanism according to the present disclosure.
Figure 10:
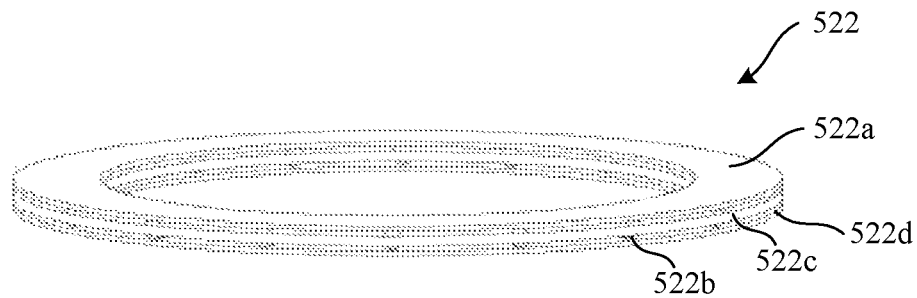
FIG. 10 shows a schematic perspective view of a rotary sliding support according to the present disclosure.
Figure 11:
FIG. 11 shows a schematic perspective view of multiple sliding posts and one limiting ring according to the present disclosure.

Specifically, referring to FIGS. 7, 8 and 9, FIGS. 7 and 8 show schematic perspective views of the rotation mechanism 500 from different angles, and FIG. 9 shows a schematic cross-sectional view of the rotation mechanism 500. The rotation mechanism 500 is fixedly connected with the telescopic assembly 300, and configured to drive the telescopic assembly 300 to perform a reciprocating rotational motion, which in turn drives the base station 201, the base shaft 202, and the passive lifting rotation member 400 to perform a reciprocating rotational motion in sequence.

In one embodiment, as shown in FIGS. 7 to 9, the rotation mechanism 500 includes a vacuum isolation ring 501, an active rotation assembly, and a passive rotation assembly. The vacuum isolation ring 501 is sleeved around the base shaft 202, a top end of the vacuum isolation ring 501 is hermetically connected with a bottom plate of the vapor deposition cavity 100, and a bottom end of the vacuum isolation ring 501 is hermetically connected with the lifting mechanism 600. The passive rotation assembly is surrounded by the vacuum isolation ring 501 and is fixedly connected with the driving ring 302. The active rotation assembly surrounds the vacuum isolation ring 501 and is configured to drive the passive rotation assembly to perform a reciprocating rotational motion through magnetic force.

In one embodiment, as shown in FIGS. 7 to 9, the active rotation assembly includes an active rotation block 502 and at least one active magnet 503. The at least one active magnet 503 is disposed on a surface of the active rotation block 502 facing the passive rotation assembly, and is apart from the vacuum isolation ring 501 by a predetermined distance. The passive rotation assembly includes a passive rotation block 504 and at least one passive magnet 505. The at least one passive magnet 505 is disposed on a surface of the passive rotation block 504 facing the active rotation assembly, and is apart from the vacuum isolation ring 501 by a predetermined distance.

In one embodiment, the active magnets 503 are strip-shaped, evenly distributed, and fixedly connected to the surface of the active rotation block 502 facing the passive rotation assembly. A certain gap is reserved between each two adjacent active magnets 503, and magnetic poles of each two adjacent active magnets 503 pointing to a center of the vacuum isolation ring 501 are opposite. The passive magnets 505 are the same as the active magnets 503 in shape, and are evenly distributed, and fixedly connected to the surface of the passive rotation block 504 facing the active rotation assembly. Magnet pole surfaces of the passive magnets 505 are arranged parallel and opposite to those of the active magnets 503, and the magnetic poles of the passive magnets 505 are orientated in directions opposite to those of the active magnets 503. When the rotation mechanism is not operating, each of the active magnets directly faces one of the passive magnets, maintaining a stable state. When the rotation mechanism starts operating, the active magnets may move relative to the passive magnets under an action of a driver, at which time a tangential force is generated between each active magnet and the corresponding passive magnet, driving the passive magnets to move as well.

In one embodiment, along a direction pointing to the center of the vacuum isolation ring 501, there may be one or more layers of active magnets 503 and/or passive magnets 505. Magnetic forces will become larger in the multi-layer configuration.

In one embodiment, as shown in FIGS. 2, and 7 to 9, the passive rotation assembly further includes a first passive rotation connector 506 and a second passive rotation connector 507, both of which are located in the rotation through hole 101. The first passive rotation connector 506 is fixedly connected to a top end of the passive rotation block 504 and a side surface of the driving ring 302. The second passive rotation connector 507 is fixedly connected to a bottom of the first passive rotation connector 506 and a bottom of the driving ring 302. Both the first passive rotation connector 506 and the second passive rotation connector 507 are made of magnetic shielding materials.

As an example, the first passive rotation connector 506 may be fixedly connected with the driving ring 302 in a clamping manner, for example, at least one slot may be formed on a side wall of the driving ring 302 for fixedly connecting the first passive rotation connector 506 with the driving ring 302.

As an example, a first guide rail 508 is disposed on a bottom surface of the first passive rotation connector 506, and a first protrusion 509 extending into the first guide rail 508 is disposed on a top surface of the vacuum isolation ring 501, so as to increase the stability of the first passive rotation connector 506 during rotation.

As an example, the active rotation block 502 is slidably connected to the vacuum isolation ring 501 through a first bearing 510 and a second bearing 511, the first bearing 510 is located above the active magnets 503, and the second bearing 511 is located below the active magnets 503. The passive rotation block 504 is slidably connected to the vacuum isolation ring 501 through a third bearing 512 and a fourth bearing 513, the third bearing 512 is located above the passive magnet 505, and the fourth bearing 513 is located below the passive magnet 505. The first protrusion 509 is slidably connected to the passive rotation block 504 through a fifth bearing 514.

As an example, a rotary sliding support 522 is disposed between a lower part of the vacuum isolation ring 501 and a lower part of the passive rotation block 504. Please refer to FIG. 10, which shows a schematic perspective view of the rotary sliding support 522. The rotary sliding support 522 includes a first sliding plate 522a, one or more sliding posts 522b, a limiting ring 522c, and a second sliding plate 522d. The first sliding plate 522a is located above the second sliding plate 522d, the one or more sliding posts 522b and the limiting ring 522c are located between the first sliding plate 522a and the second sliding plate 522d. Please refer to FIG. 11, which shows a schematic perspective view of the one or more sliding posts 522b and the limiting ring 522c. The one or more sliding posts 522b are circumferentially and evenly embedded in the limiting ring 522c.

As an example, the rotation mechanism 500 further includes a rotary drive assembly, the rotary drive assembly includes a stator 515 and a rotor 516. The rotor 516 is fixedly connected with a bottom of the active rotation assembly, and the stator 515 is fixedly connected with the vapor deposition cavity 100 through a fixing bracket 800, sleeved around the rotor 516, and configured to drive the rotor 516 to perform a reciprocating rotational motion.

Figure 12:
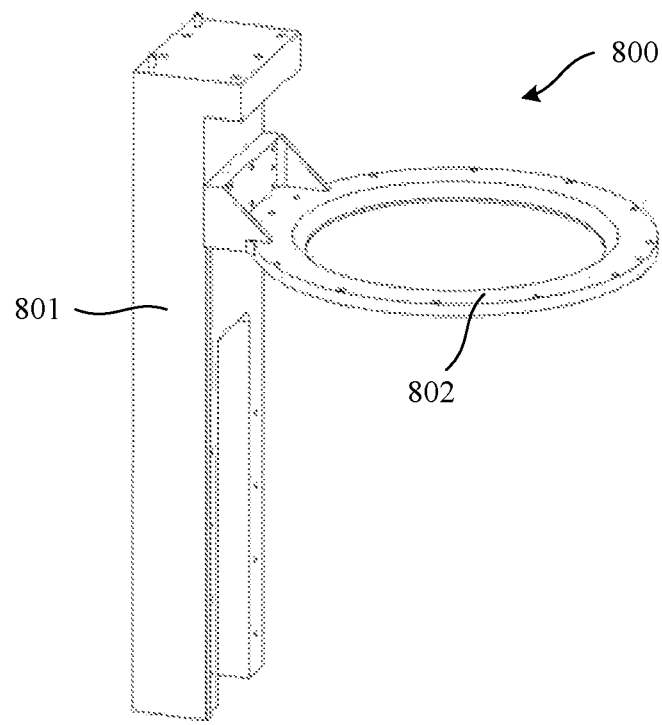
FIG. 12 shows a schematic perspective view of a fixing bracket according to the present disclosure.

As an example, please refer to FIG. 12, which shows a schematic perspective view of the fixing bracket 800. The fixing bracket 800 includes a first bracket 801 and a second bracket 802, a top end of the first bracket 801 is fixedly connected with the vapor deposition cavity 100, the second bracket 802 is disposed at one side of the first bracket 801 and is sleeved around the active rotation assembly, and the stator 515 is fixedly connected with the second bracket 802, so as to support the rotation mechanism 500 by fixing the fixing bracket 800 and the rotation mechanism 500 relative to each other.

In one embodiment, as shown in FIGS. 2, and 7 to 9, the rotary drive assembly further includes a stator connector 517 and a rotor connector 518, the stator connector 517 is fixedly connected with the stator 515, a second guide rail 519 is disposed at a bottom of the rotor 516, a second protrusion 520 extending into the second guide rail 519 is disposed at a top of the rotor connector 518 and slidably connected with the rotor 516. Specifically, the stator connector 517 is fixedly connected with a bottom of the stator 515. An end of the stator connector 517 close to a center of the stator 515 is bent upward to form a sliding space with the rotor connector 518. A sixth bearing 521 is disposed in the sliding space, and the stator connector 517 and the rotor connector 518 are slidably connected through the sixth bearing 521. The second protrusion 520 extends into the second guide rail 519 so as to improve the rotation stability of the rotor 516.

Figure 13:
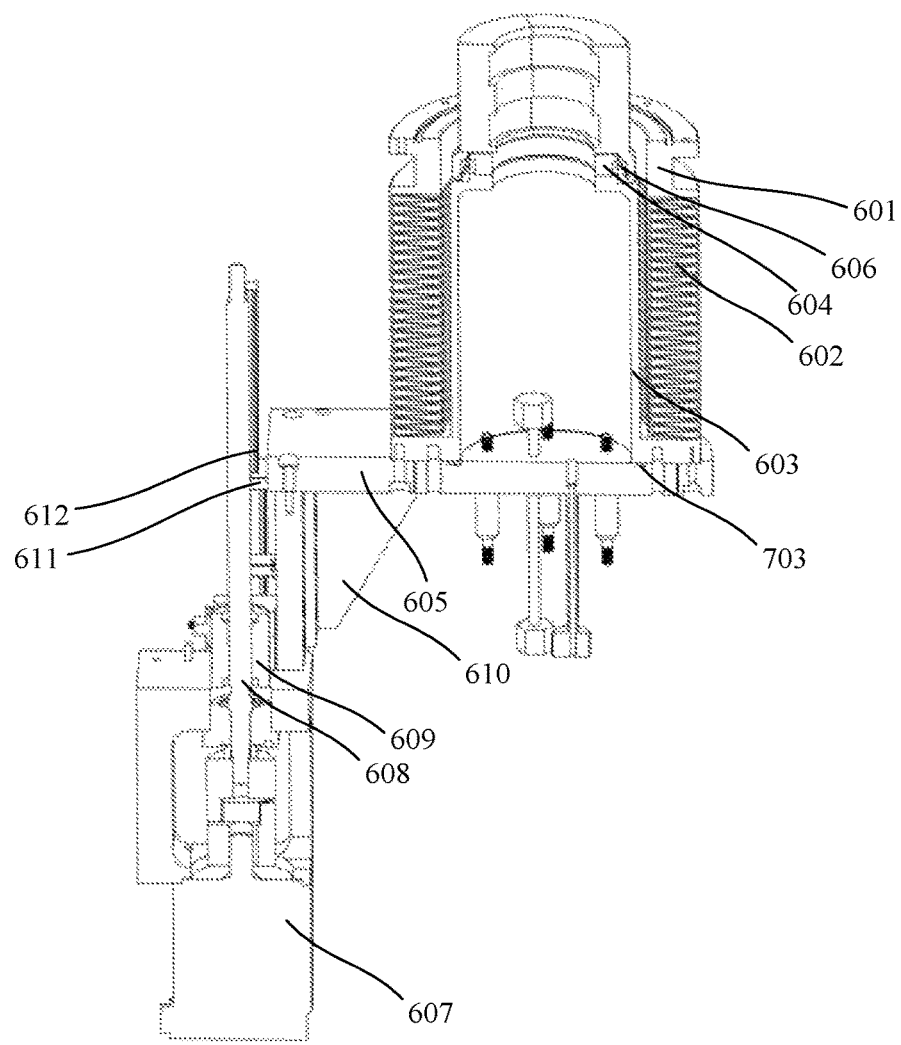
FIG. 13 shows a schematic cross-sectional view of a lifting mechanism and a passive lifting rotation member according to the present disclosure.
Figure 14:
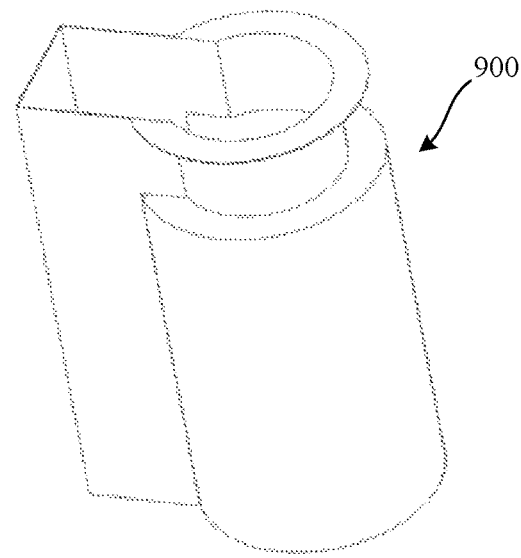
FIG. 14 shows a schematic perspective view of a magnetic shielding protective cover according to the present disclosure.

Specifically, please refer to FIG. 13, which shows a schematic cross-sectional view of the lifting mechanism 600 and the passive lifting rotation member 400. The lifting mechanism 600 is rotatably and slidably connected with the passive lifting rotation member 400, and configured to drive the passive lifting rotation member 400 to move up and down, which in turn drives the base shaft 202 and the base station 201 to move up and down. The telescopic assembly 300 extends when the base station 201 ascends, and shortens when the base station 201 descends.

As an example, the lifting mechanism 600 includes a pipe-sleeve fixing ring 601, a telescopic-pipe sleeve 602, a wire accommodating cavity 603, a wire-accommodating-cavity connector 604, a lifting station 605, and a lifting drive device. The wire-accommodating-cavity connector 604 is located in the passive lifting rotation member 400 and is rotatably and slidably connected with the passive lifting rotation member 400 through a seventh bearing 606. The electrical wire 203 extends into the wire accommodating cavity 603. A top of the wire accommodating cavity 603 is fixedly connected with the wire-accommodating-cavity connector 604, and a bottom of the wire accommodating cavity 603 is hermetically connected with the lifting station 605. The telescopic-pipe sleeve 602 is sleeved around the wire accommodating cavity 603 and is apart from an outer side wall of the wire accommodating cavity 603 by a predetermined distance. The pipe-sleeve fixing ring 601 is sleeved around the passive lifting rotation member 400, a top of the pipe-sleeve fixing ring 601 is hermetically connected with a bottom of the vacuum isolation ring 501, a bottom of the pipe-sleeve fixing ring 601 is hermetically connected with a top end of the telescopic-pipe sleeve 602, and a bottom end of the telescopic-pipe sleeve 602 is hermetically connected with a bottom of the wire accommodating cavity 603. The lifting drive device is connected with the lifting station 605 and configured to drive the lifting station 605 to move up and down, which in turn drives the wire accommodating cavity 603, the wire-accommodating-cavity connector 604, the passive lifting rotation member 400, the base shaft 202, and the base station 201 to move up and down in sequence. The telescopic-pipe sleeve 602 shortens when the wire accommodating cavity 603 ascends, and extends when the wire accommodating cavity 603 descends.

As an example, the telescopic-pipe sleeve 602 includes corrugated pipes.

As an example, referring to FIG. 2, a first sealing ring 701 is disposed between the top end of the vacuum isolation ring 501 and the bottom plate of the vapor deposition cavity 100 for sealing connection, and a first sealing groove is disposed at the top end of the vacuum isolation ring 501 or the bottom plate of the vapor deposition cavity 100 for accommodating the first sealing ring 701. A second sealing ring 702 is disposed between a top end of the pipe-sleeve fixing ring 601 and a bottom end of the vacuum isolation ring 501 for sealing connection, and a second sealing groove is disposed at the top end of the pipe-sleeve fixing ring 601 or the bottom end of the vacuum isolation ring 501 for accommodating the second sealing ring 702. A third sealing ring 703 is disposed between a bottom of the wire accommodating cavity 603 and a top of the lifting station 605 for sealing connection, and a third sealing groove is disposed at the bottom of the wire accommodating cavity 603 or the top of the lifting station 605 for accommodating the third sealing ring 703. Both the telescopic-pipe sleeve 602 and the pipe-sleeve fixing ring 601 are sleeved around the passive lifting rotation member 400. In this way, internal spaces of the vapor deposition cavity 100, the vacuum isolation ring 501, the pipe-sleeve fixing ring 601, the telescopic-pipe sleeve 602, and the wire accommodating cavity 603 are communicated with each other and isolated from the external space. The present disclosure enables a purely physical ultra-high vacuum state through a design that physically isolates the vapor deposition device.

As an example, referring to FIG. 13, the lifting drive device includes a lifting drive motor 607, a threaded rod 608, a threaded block 609, and a lifting bracket 610. The lifting drive motor 607 is connected with the threaded rod 608 and configured to drive the threaded rod 608 to rotate. The threaded block 609 is sleeved around the threaded rod 608 and provided with threads mating with the threaded rod 608, so as to ascend or descend along with a rotation of the threaded rod 608 (the threaded block 609 does not rotate). The lifting bracket 610 is fixedly connected to the threaded block 609 and the lifting station 605 to further drive the lifting station 605 to ascend or descend when driven by the threaded block 609.

As an example, referring to FIG. 2, the lifting drive device is fixedly connected with the vapor deposition cavity 100 through the fixing bracket 800, and in this embodiment, the lifting drive device is fixedly connected with a bottom of the first bracket 801 of the fixing bracket 800.

As an example, the lifting drive device further includes a lifting slide rail 611 and a lifting guide rail 612. The lifting guide rail 612 is disposed at one side of the fixing bracket 800 facing the lifting bracket 610, and the lifting slide rail 611 is disposed at one side of the lifting bracket 610 facing the first bracket 801. The lifting slide rail 611 matches the lifting guide rail 612 in shape and is configured to slidably ascend or descend along the lifting guide rail 612, improving the stability of lifting.

The vapor deposition device of the present disclosure can coordinate the lifting and rotating of the wafer base without breaking the high vacuum state, warm up the wafers, and avoid physical entanglement and damage of electrical wires by using a reciprocating rotation mechanism. The coordination principle of the lifting and rotating of the wafer base is as follows: the rotation mechanism 500 is fixedly connected with the telescopic assembly 300, and configured to drive the telescopic assembly 300 to perform a reciprocating rotational motion, which in turn drives the base station 201, the base shaft 202, and the passive lifting rotation member 400 to perform a reciprocating rotational motion in sequence. Next, the lifting mechanism 600 is rotatably and slidably connected with the passive lifting rotation member 400, and configured to drive the passive lifting rotation member 400 to move up and down, which in turn drives the base shaft 202 and the base station 201 to move up and down. Then, the telescopic assembly 300 extends when the base station 201 ascends, and shortens when the base station 201 descends. As the lifting mechanism 600 is rotatably and slidably connected with the passive lifting rotation member 400, the lifting mechanism 600 does not affect the rotation of the passive lifting rotation member 400 when driving the passive lifting rotation member 400 to move up and down, which in turn does not affect the rotation of the base shaft 202 and the base station 201.

As an example, in order to prevent the strong magnetic field generated by a magnetic coupling rotation mechanism from adversely affecting the deposition environment inside the cavity, the bottom plate of the vapor deposition cavity 100 is made of magnetic shielding materials, or the bottom plate of the vapor deposition cavity 100 includes a magnetic shielding material layer.

As an example, in order to prevent the strong magnetic from adversely affecting the external environment, which may cause possible damages to the surrounding electrical devices and the operator's health, the vapor deposition device further includes a magnetic shielding protective cover 900. Please refer to FIG. 14, which shows a schematic perspective view of the magnetic shielding protective cover 900. The magnetic shielding protective cover 900 is sleeved around the rotation mechanism 500 and connected with the bottom plate of the vapor deposition cavity 100. In one embodiment, the magnetic shielding protective cover 900 further surrounds the fixing bracket 800.

In summary, the vapor deposition device of the present disclosure allows wafer bases to lift and rotate simultaneously without interfering with each other, and is also capable of heating the wafers. It also avoids the problem of physical entanglement and damage of electrical wires by using a reciprocating rotation mechanism. Furthermore, by combining a lifting drive motor that adopts a torque-driven mode, a rotation mechanism that employs magnetic coupling principles, and a design that utilizes purely physical isolation, the vapor deposition device can achieve a purely physical ultra-high vacuum state. The bottom of the vapor deposition cavity has a magnetic shielding assembly, which can prevent the strong magnetic field generated by a magnetic coupling rotation mechanism from adversely affecting the deposition environment inside the cavity as well as the external environment, effectively avoiding possible damages to the surrounding electrical devices and the operator's health. Therefore, the present disclosure effectively overcomes various shortcomings in the existing technology and has high industrial utilization value.

The above-mentioned embodiments are for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the scope of the present disclosure.

The invention claimed is:

1. A vapor deposition device capable of reciprocating rotation and lifting, including:
    a vapor deposition cavity, wherein a rotation through hole is formed on a bottom of the vapor deposition cavity;
    a base, including a base station and a base shaft, wherein the base station is located in the vapor deposition cavity, the base shaft is located below the base station and is fixedly connected with the base station, and a bottom end of the base shaft passes through the rotation through hole to extend out of the vapor deposition cavity;
    a telescopic assembly, including a telescopic tubular member and a driving ring, wherein the telescopic tubular member is sleeved around the base shaft and is located inside the vapor deposition cavity, a top end of the telescopic tubular member is fixedly connected with the base station, and a bottom end of the telescopic tubular member is fixedly connected with the driving ring; wherein the telescopic tubular member includes corrugated pipes;
    a passive lifting rotation member having a ring-shaped structure, sleeved around the base shaft and fixedly connected to the base shaft, configured to move along with the base shaft;
    a rotation mechanism, fixedly connected with the telescopic assembly, and configured to drive the telescopic assembly to perform a reciprocating rotational motion, which in turn drives the base station, the base shaft, and the passive lifting rotation member to perform a reciprocating rotational motion; wherein
    the rotation mechanism includes an active rotation assembly and a passive rotation assembly, the passive rotation assembly is fixedly connected with the driving ring, and the active rotation assembly drives the passive rotation assembly to perform a reciprocating rotational motion through magnetic force;
    the active rotation assembly includes an active rotation block and at least one active magnet, and the at least one active magnet is disposed on a surface of the active rotation block facing the passive rotation assembly; wherein the passive rotation assembly includes a passive rotation block and at least one passive magnet, and the at least one passive magnet is disposed on a surface of the passive rotation block facing the active rotation assembly; and
    the passive rotation assembly further includes a first passive rotation connector located inside the rotation through hole, the first passive rotation connector is fixedly connected to a top end of the passive rotation block and a side surface of the driving ring; and
    a lifting mechanism, rotatably and slidably connected with the passive lifting rotation member, and configured to drive the passive lifting rotation member to move up and down, which in turn drives the base shaft and the base station to move up and down; wherein the telescopic assembly extends when the base station ascends and shortens when the base station descends.

2. The vapor deposition device according to claim 1, wherein the rotation mechanism further includes a vacuum isolation ring; wherein the vacuum isolation ring is sleeved around the base shaft, a top end of the vacuum isolation ring is hermetically connected with a bottom plate of the vapor deposition cavity, and a bottom end of the vacuum isolation ring is hermetically connected with the lifting mechanism; wherein the passive rotation assembly is surrounded by the vacuum isolation ring, and the active rotation assembly surrounds the vacuum isolation ring.

3. The vapor deposition device according to claim 2, wherein the passive rotation assembly further includes a second passive rotation connector located in the rotation through hole; wherein a first guide rail is disposed on a bottom surface of the first passive rotation connector, and a first protrusion extending into the first guide rail is disposed on a top surface of the vacuum isolation ring; wherein the second passive rotation connector is fixedly connected to a bottom of the first passive rotation connector and a bottom of the driving ring.

4. The vapor deposition device according to claim 3, wherein both the first passive rotation connector and the second passive rotation connector are made of magnetic shielding materials.

5. The vapor deposition device according to claim 3, wherein the first protrusion is slidably connected to the passive rotation block through a fifth bearing.

6. The vapor deposition device according to claim 2, wherein the active rotation block is slidably connected to the vacuum isolation ring through a first bearing and a second bearing, the first bearing is located above the active magnet, and the second bearing is located below the active magnet; wherein the passive rotation block is slidably connected to the vacuum isolation ring through a third bearing and a fourth bearing, the third bearing is located above the passive magnet, and the fourth bearing is located below the passive magnet.

7. The vapor deposition device according to claim 2, wherein a rotary sliding support is disposed between a bottom of the vacuum isolation ring and a bottom of the passive rotation block.

8. The vapor deposition device according to claim 7, wherein the rotary sliding support includes a first sliding plate, one or more sliding posts, a limiting ring, and a second sliding plate; wherein the first sliding plate is located above the second sliding plate, the one or more sliding posts and the limiting ring are located between the first sliding plate and the second sliding plate, and the one or more sliding posts are circumferentially and evenly embedded in the limiting ring.

9. The vapor deposition device according to claim 2, wherein the rotation mechanism further includes a rotary drive assembly, the rotary drive assembly includes a stator and a rotor; wherein the rotor is fixedly connected with a bottom of the active rotation assembly, and the stator is fixedly connected with the vapor deposition cavity through a fixing bracket, sleeved around the rotor, and configured to drive the rotor to perform a reciprocating rotational motion.

10. The vapor deposition device according to claim 9, wherein the fixing bracket includes a first bracket and a second bracket, a top end of the first bracket is fixedly connected with the vapor deposition cavity, the second bracket is disposed at one side of the first bracket and is sleeved around the active rotation assembly, and the stator is fixedly connected with the second bracket.

11. The vapor deposition device according to claim 9, wherein the rotary drive assembly further includes a stator connector and a rotor connector, the stator connector is fixedly connected with the stator, a second guide rail is disposed at a bottom of the rotor, a second protrusion extending into the second guide rail is disposed at a top of the rotor connector and slidably connected with the rotor, and the stator connector and the rotor connector are slidably connected through a sixth bearing.

12. The vapor deposition device according to claim 2, wherein the lifting mechanism includes a pipe-sleeve fixing ring, a telescopic-pipe sleeve, a wire accommodating cavity, a wire-accommodating-cavity connector, a lifting station, and a lifting drive device; wherein the wire-accommodating-cavity connector is located in the passive lifting rotation member and is rotatably and slidably connected with the passive lifting rotation member through a seventh bearing; wherein a top of the wire accommodating cavity is fixedly connected with the wire-accommodating-cavity connector, and a bottom of the wire accommodating cavity is hermetically connected with the lifting station; wherein the telescopic-pipe sleeve is sleeved around the wire accommodating cavity and is apart from an outer side wall of the wire accommodating cavity by a predetermined distance; wherein the pipe-sleeve fixing ring is sleeved around the passive lifting rotation member, a top of the pipe-sleeve fixing ring is hermetically connected with a bottom of the vacuum isolation ring, a bottom of the pipe-sleeve fixing ring is hermetically connected with a top end of the telescopic-pipe sleeve, and a bottom end of the telescopic-pipe sleeve is hermetically connected with a bottom of the wire accommodating cavity; wherein the lifting drive device is connected with the lifting station and configured to drive the lifting station to move up and down, which in turn drives the wire accommodating cavity, the wire-accommodating-cavity connector, the passive lifting rotation member, the base shaft, and the base station to move up and down in sequence; wherein the telescopic-pipe sleeve shortens when the wire accommodating cavity ascends and extends when the wire accommodating cavity descends.

13. The vapor deposition device according to claim 12, wherein the telescopic-pipe sleeve includes corrugated pipes.

14. The vapor deposition device according to claim 12, wherein the lifting drive device includes a lifting drive motor, a threaded rod, a threaded block, and a lifting bracket; wherein the lifting drive motor is connected with the threaded rod and configured to drive the threaded rod to rotate, the threaded block is sleeved around the threaded rod and configured to ascend or descend along with a rotation of the threaded rod, and the lifting bracket is fixedly connected to the threaded block and the lifting station.

15. The vapor deposition device according to claim 14, wherein the lifting drive device is fixedly connected with the vapor deposition cavity through a fixing bracket; wherein the lifting drive device further includes a lifting slide rail and a lifting guide rail, the lifting guide rail is disposed at one side of the fixing bracket, the lifting slide rail is disposed at one side of the lifting bracket, and the lifting slide rail matches the lifting guide rail in shape and is configured to slidably ascend or descend when the lifting guide rail ascend or descend.

16. The vapor deposition device according to claim 1, wherein a bottom plate of the vapor deposition cavity is made of magnetic shielding materials, or a bottom plate of the vapor deposition cavity includes a magnetic shielding material layer.

17. The vapor deposition device according to claim 16, further including a magnetic shielding protective cover, wherein the magnetic shielding protective cover is sleeved around the rotation mechanism and connected with the bottom plate of the vapor deposition cavity.

* * * * *